United States Patent [19]
Ting et al.

[11] Patent Number: 5,689,200
[45] Date of Patent: Nov. 18, 1997

[54] HIGH SPEED GLITCH-FREE TRANSITION DETECTION CIRCUIT WITH DISABLE CONTROL

[75] Inventors: Tah-Kang Joseph Ting; Jeng-Tzong Shih; Yung-Ching Hsieh, all of Hsinchu, Taiwan

[73] Assignee: Etron Technology, Inc., Hsin-chu, Taiwan

[21] Appl. No.: 682,456

[22] Filed: Jul. 17, 1996

[51] Int. Cl.[6] ................................ H03K 5/153
[52] U.S. Cl. ................ 327/78; 327/50; 327/227
[58] Field of Search ............... 365/233.5; 327/50, 327/77, 78, 80, 81, 88, 14, 15, 17, 24, 51, 227, 427

[56] References Cited

U.S. PATENT DOCUMENTS

| | | |
|---|---|---|
| 4,742,247 | 5/1988 | Venkatesh ............... 327/172 |
| 4,963,765 | 10/1990 | Kadakia et al. ........... 307/443 |
| 4,996,671 | 2/1991 | Suzuki et al. ............. 365/203 |
| 5,268,874 | 12/1993 | Yamauchi ............... 365/233.5 |
| 5,306,958 | 4/1994 | Reddy et al. ............ 327/172 |
| 5,438,550 | 8/1995 | Kim ...................... 365/233.5 |
| 5,475,320 | 12/1995 | Ko ........................ 365/233.5 |
| 5,519,666 | 5/1996 | McAdams ............... 327/161 |
| 5,553,033 | 9/1996 | McAdams ............... 365/233.5 |

*Primary Examiner*—Toan Tran
*Attorney, Agent, or Firm*—George O. Saile; Stephen B. Ackerman

[57] ABSTRACT

A high speed clock-positive edge detection circuit with chip select control that produces a glitch-free transition detection pulse is described. The circuit comprises Logic, Conditioning and Output Sections. An n-channel transistor is connected between output C, output B and the Chip Select input. This eliminates glitches that would otherwise be present, as in the prior art.

17 Claims, 3 Drawing Sheets

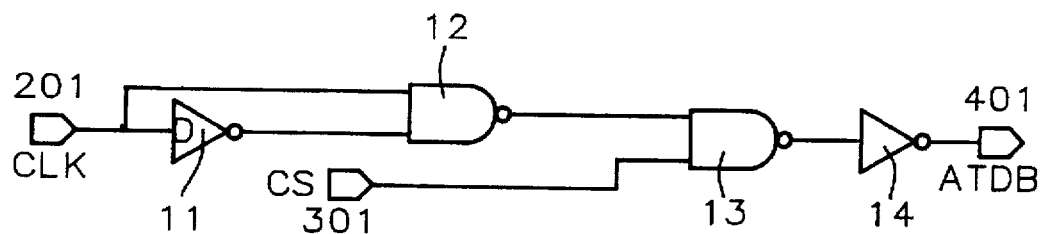
*FIG. 1 - Prior Art*
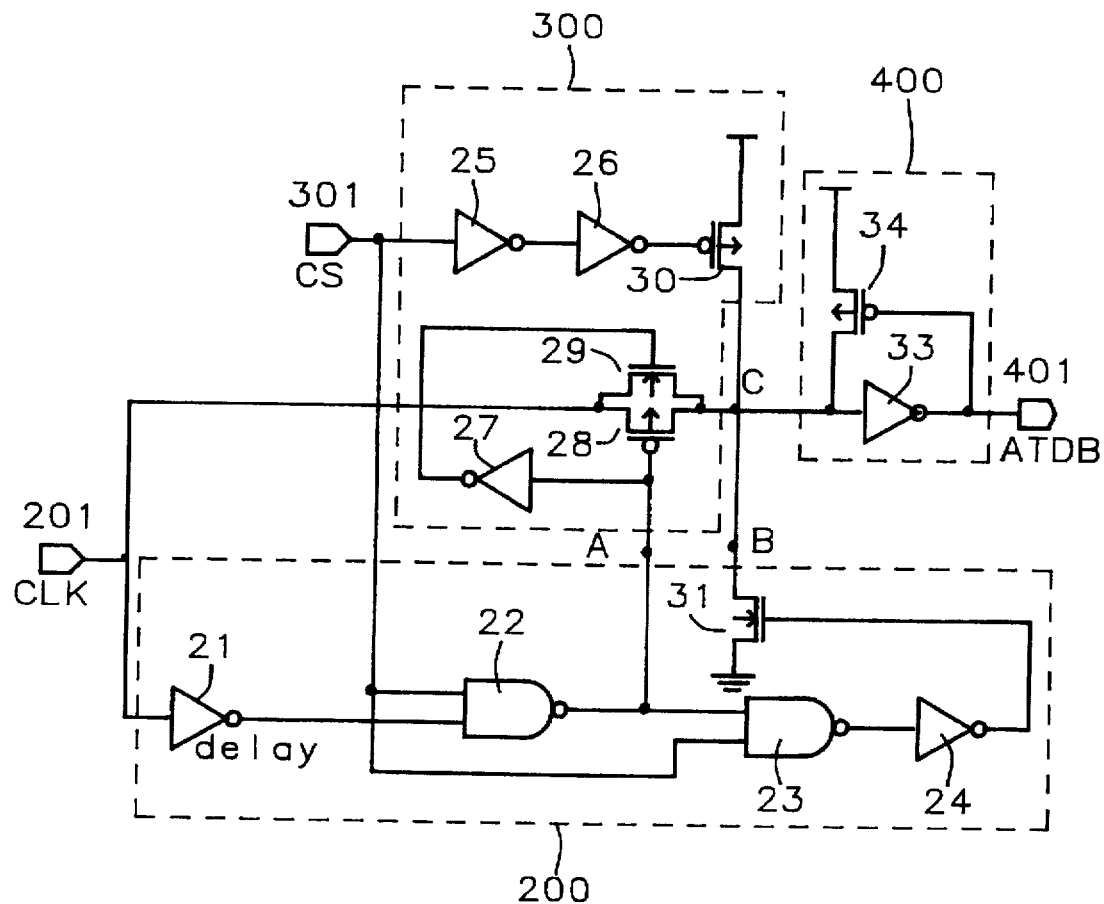
*FIG. 2 - Prior Art*

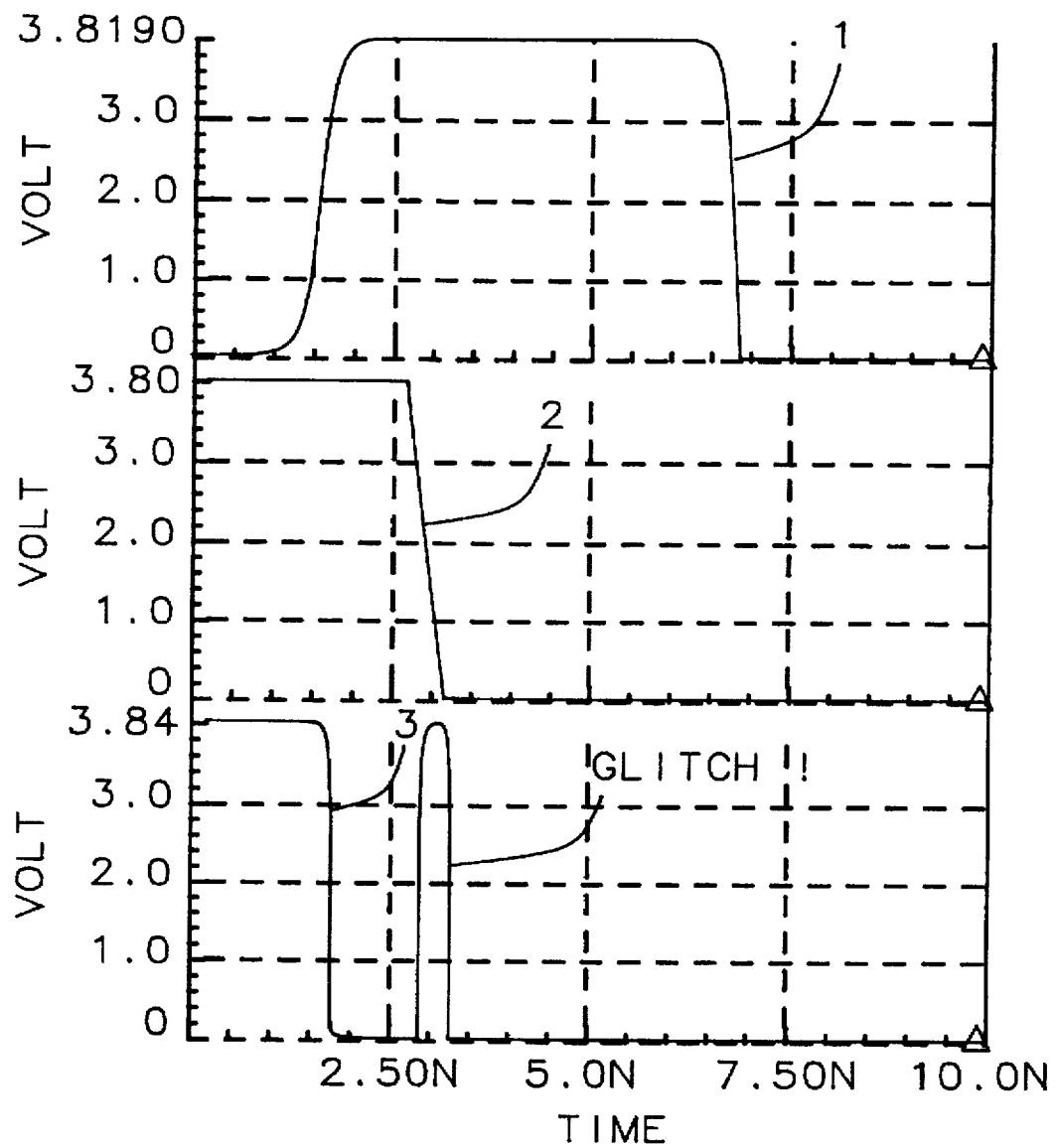
FIG. 3 - Prior Art

5,689,200

HIGH SPEED GLITCH-FREE TRANSITION DETECTION CIRCUIT WITH DISABLE CONTROL

BACKGROUND OF THE INVENTION

1. Field of the Invention

This invention relates to the field of voltage detection devices, more particularly to one that is glitch free.

2. Description of the Prior Art

Referring now to FIG. 1 a conventional transition detection circuit, with disable control for a Static Random Access Memory (SRAM), is shown. It consists of inverter 11, with a predetermined signal delay, NAND gates 12 and 13 and inverter 14 which connects to output ATDB (Address Transition Detect B) 401. Clock input pulse (CLK) 201 connects to inverter 11 and NAND gate 12. Chip select input (CS) 301 connects to NAND gate 13.

When CLK 201 goes positive and if CS 301 is positive (enable) a negative going output pulse 401 from inverter 14 results. This causes the internal SRAM circuitry to become active. If CS 301 drops (disable) during the delayed and inverted CLK pulse 201 (inverter 11), then the output from inverter 14 drops negative and stays negative. The SRAM is then on standby.

FIG. 2 shows a high speed transition detection circuit with disable control for an SRAM. FIG. 3 shows the associated CLK input signal 201 (CURVE 1), CS input signal 301 (CURVE 2) and the ATDB output signal 401 (CURVE 3) of the circuit. The circuit of FIG. 2 consists of a Logic Section 200 with inputs 201, 301, outputs A, B and components 21 through 24 and 31, a Conditioning Section 300 with inputs 201, 301, output C (terminal C) and components 25 through 30 and an Output Section 400 with input C, output 401 and components 33 and 34.

The clock 201 (CLK) signal feeds inverter 21 (with a predetermined signal delay). The output of inverter 21 connects to NAND gate 22 as does the chip select 301 (CS) signal. The output of NAND gate 22 (output A) feeds one input of NAND gate 23. The other input of NAND gate 23 is connected to the CS signal 301. The output of NAND gate 23 feeds inverter 24. Inverter 24 output connects to the gate of n-channel transistor 31, with source connected to ground and with drain connected to output B.

When CS 301 stays positive (enable) during the SRAM cycle, both NAND gate 22 and inverter 24 produce a positive pulse equal in width to the CLK 201 signal. When CS 301 drops (disable) during the SRAM cycle, output A produces a positive transition, while inverter 24 produces a short positive pulse whose length is determined by the fall of inverter 21 and the fall of the CS input 301. This positive pulse causes n-channel transistor 31 to conduct. This leads to the glitch described below.

FIG. 2 further shows p-channel transistor 30 connected via inverters 25 and 26 to CS 301. Its source is connected to the supply voltage, its drain to output C. This device only conducts, and affects output C, when CS 301 drops negative. When the CLK input 201 goes positive and if CS 301 input stays positive (enable), then p-channel transistor 28 and n-channel transistor 29 conduct until inverter 21 output goes negative. When transistors 28 and 29 conduct, the voltage seen at output C is close to the up-level of the CLK signal 201. This produces a negative pulse at output (ATDB) 401 which conditions the SRAM.

When, however, CS 301 drops (disable) then n-channel transistor 31 conducts as explained above and output B/C is getting pulled to ground. Thus the output of inverter 33, and output ATDB 401, get pulled up briefly. This is GLITCH 1 seen in FIG. 3, CURVE 3.

A variety of detection circuits have been described in the patent literature. For example U.S. Pat. No. 4,963,765 (Kadakia, et al.) discloses a high-speed CMOS transition detection circuit having no disable control, while it is unclear if an input glitch would propagate through to the output node. U.S. Pat. No. 4,996,671 (Suzuki, et al.) provides high-speed address transition to drive a pre-charging circuit for an SRAM. U.S. Pat. No. 5,268,874 (Yamauchi) briefly discusses a high-speed address detection used in a DRAM read operation. None of the above patents address the problem of eliminating glitches in circuits of such high speed.

SUMMARY OF THE INVENTION

It is an objective of this invention to provide a glitch-free transition detection circuit.

These objectives have been accomplished by providing a circuit comprised of Logic, Conditioning and Output Sections. An n-channel transistor is connected between output C, output B and the Chip Select signal input. This eliminates glitches that would otherwise be present, as in the prior art.

BRIEF DESCRIPTION OF THE DRAWINGS

FIG. 1 is a circuit diagram showing a prior art transition detection circuit with disable control.

FIG. 2 is a circuit diagram showing a prior art high speed transition detection circuit with disable control.

FIG. 3 is a view of the input and output signals of the circuit as shown in FIG. 2.

DESCRIPTION OF THE PREFERRED EMBODIMENT

Figure 4A:
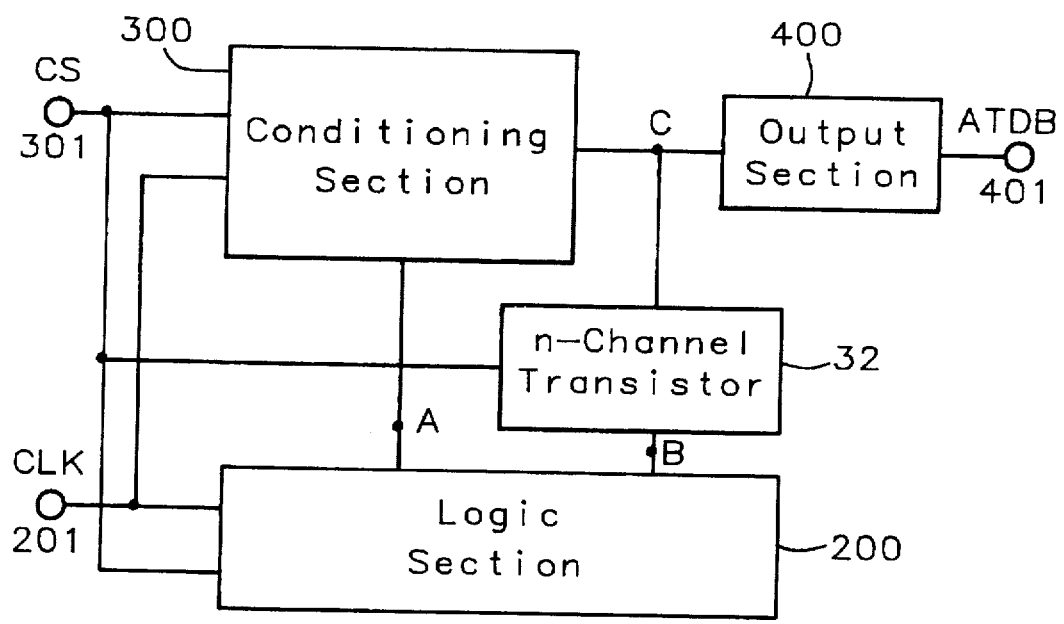
FIG. 4a is a high level block diagram of FIG. 4b.

Referring to FIG 4a we show now a high level view of the principle components of this present invention. Logic Section 200 is connected at output A to Conditioning Section 300 and at output B to n-channel transistor 32. Control Section 300 is connected at output C (terminal C) to n-channel transistor 32 and to Output Section 400. Signal inputs 201 and 301 connect to inputs of Logic Section 200 and Conditioning Section 300. Signal input 301 also connects to the input (gate) of n-channel transistor 32. The output of Output Section 400 connects to output 401. A key feature is the presence of n-channel transistor 32 which as shown has been inserted between output B and C.

Figure 4B:
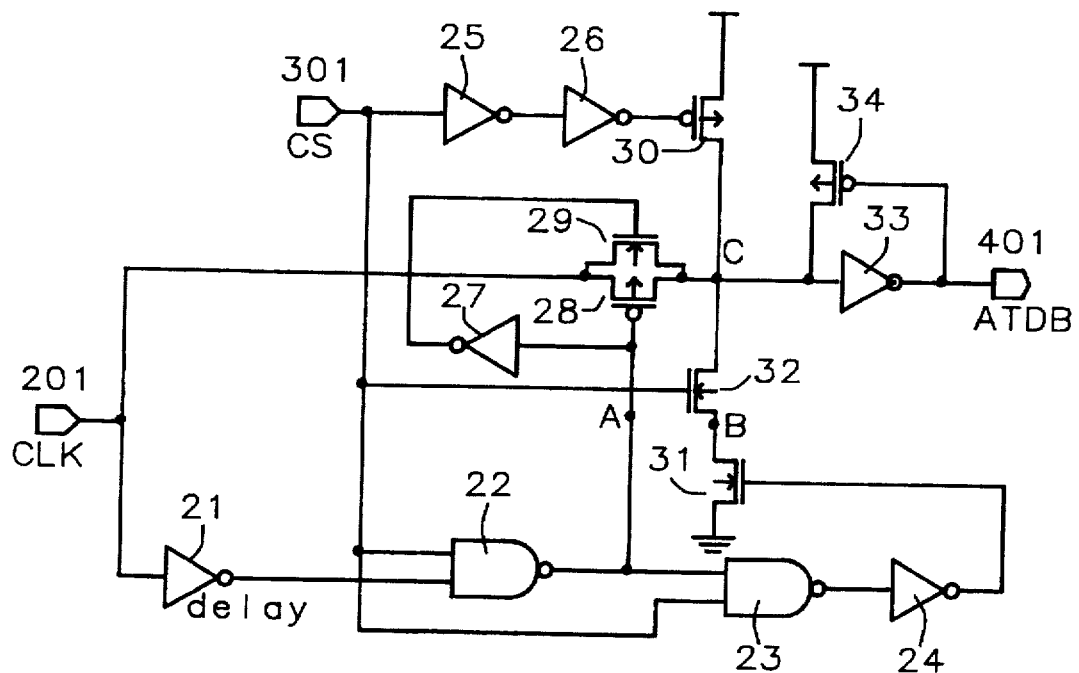
FIG. 4b is a circuit diagram showing the high speed glitch-free transition detection circuit with disable control of the present invention.

FIG. 4b shows a high speed glitch-free transition detection circuit with disable control for an SRAM. FIG. 3 shows the associated clock (CLK) input signal 201 (CURVE 1) and chip select (CS) input signal 301 (CURVE 2).

The CLK signal 201 feeds inverter 21 (with a predetermined signal delay). The output of inverter 21 connects to NAND gate 22 as does the CS 301 signal. The output of NAND gate 22 (output A) feeds one input of NAND gate 23. The other input of NAND gate 23 is connected to the CS signal 301. The output of NAND gate 23 feeds inverter 24. Inverter 24 output connects to the gate of n-channel transistor 31, with source connected to ground (reference potential) and with drain connected to output B.

Prior to CS 301 dropping inverter 24 is near ground and transistor 31 is not conducting. Output B, equal to the source of transistor 32, is one threshold drop below the gate of transistor 32. Output C (terminal C) therefore is at a level near the supply voltage. When CS 301 drops (disable) during the SRAM cycle, output A produces a positive transition, while inverter 24 produces a short positive pulse whose length is determined by the fall of inverter 21 and the fall of the CS input 301. This positive pulse causes n-channel transistor 31 to conduct. A signal with a voltage level near ground appears during this period on output B.

FIG. 4b further shows the gate of p-channel transistor 30 connected via inverters 25 and 26 to CS 301. Its source is connected to the supply voltage, its drain to output C. This device only conducts, and pulls up output C to near the supply voltage, when CS 301 drops negative. P-channel transistor 28, with its gate connected to output A, has its source connected to the CLK input 201 and its drain to output C. N-channel transistor 29, whose gate is connected via inverter 27 to output A, is connected in parallel to p-channel transistor 28. This invention now introduces n-channel transistor 32 in series between output C and output B, with its gate directly connected to input CS 301.

Five transistors determine the voltage level at output C. Transistors 28 and 29 determine the leading edge and up-level at output C up to CS 301 dropping. In the prior art, shortly after CS 301 drops, transistor 31 would briefly conduct ground to output C (terminal C), followed by transistor 30 restoring output C to a positive level. This glitch condition, caused by transistor 31, is eliminated by transistor 32 because transistor 32 does not conduct at that time and therefore does not pass the glitch through to output C.

After CS 301 drops, transistor 32 turns off very rapidly since it is kept biased outside of the saturation region so that the source of the transistor is only one threshold drop from its gate. A high impedance is thus maintained, keeping the ground away from output C. The up-level at output C is maintained by transistor 30 going into conduction as CS 301 drops.

Lastly inverter 33, its input connected to output C and its output connected to output ATDB 401, reverses the polarity of the signal for the SRAM. P-channel transistor 34, its gate connected to inverter 33 output and its source-drain connected between the supply voltage and output C, sharpens the leading edge transition of the output pulse.

While the invention has been particularly shown and described with reference to the preferred embodiments thereof, it will be understood by those skilled in the art that various changes in form and details may be made without departing from the spirit and scope of the invention.

What is claimed is:

1. An edge detection circuit comprising:

a logic section having a first and a second signal input and a first output of the logic section and a second output of the logic section, said logic section outputs providing signal gating;

a conditioning section coupled to said first and second signal inputs and a third input, said third input connected to said first output of said logic section, and an output, said output of said conditioning section connected to a terminal C, said conditioning section determining the voltage level at said terminal C;

an output section with an input and an output, said input of said output section connected to said terminal C, said output of said output section providing a disable control; and an N-channel transistor section having a source terminal, a drain terminal and a gate terminal, said drain terminal connected to said terminal C, said source terminal connected to said second output of the login section, and said gate terminal connected to the second signal input, said N-channel transistor section inhibiting a glitch from propagating through to said terminal C.

2. The circuit of claim 1, wherein said logic section comprises:

a reference potential;

said first signal input, to which a first signal is applied, said signal corresponding to a transition in voltage;

said second signal input, to which a second signal is applied, said signal corresponding to a transition in voltage;

a first inverter with an input and an output, said inverter having a predetermined signal delay, said input of said first inverter connected to said first signal input;

a first 2-input NAND gate with an output, with one input of said first NAND gate connected to the output of said first inverter and the other input of said first NAND gate connected to said second signal input, said output of said first 2-input NAND gate corresponding to said first output of said logic section;

a second 2-input NAND gate with an output, with one input of said second NAND gate connected to said second signal input and the other input of said second NAND gate connected to the output of said first NAND gate;

a second inverter with an input and an output, said input of said second inverter connected to the output of said second NAND gate; and a first n-channel transistor having a source-drain path and a gate, said source-drain of said first n-channel transistor connected between the reference potential and said second output of said logic section, and said gate of said first n-channel transistor connected to the output of said second inverter.

3. The circuit of claim 1, wherein the conditioning section comprises:

a supply voltage;

a first inverter with an input and an output, said input of said first inverter connected to said second signal input;

a second inverter with an input and an output, said input of said second inverter connected to said output of said first inverter;

a first p-channel transistor having a source-drain path and a gate, said source-drain of said first p-channel transistor connected between the supply voltage and said output of the conditioning section, said gate of said first p-channel transistor connected to the output of the second inverter;

a second p-channel transistor having a source-drain path and a gate, said source-drain of said second p-channel transistor connected between the first signal input and said output of the conditioning section, the gate of said second p-channel transistor connected to said first output of said logic section;

a third inverter with an input and an output, said input of said third inverter connected to said first output of said logic section; and a second n-channel transistor having a source-drain path and a gate, said source-drain of said second n-channel transistor connected between said output of the conditioning section and the first signal input, said gate of said second n-channel transistor connected to the output of the third inverter.

4. The circuit of claim 1, wherein the output section comprises:

a first inverter with an input and an output, said input of said first inverter connected to said input of said output section, said output of said first inverter connected to the output of said output section; and a first p-channel transistor having a source-drain path and a gate, said source-drain of said first p-channel transistor connected between a supply voltage and said input of said output section, and said gate of said first p-channel transistor connected to the output of the first inverter.

5. The circuit of claim 1, wherein the N-channel transistor section comprises:

a first n-channel transistor having a source-drain path and a gate, said source of said first n-channel transistor corresponding to said source terminal, said drain of said first n-channel transistor corresponding to said drain terminal and said gate of said first n-channel transistor corresponding to said gate terminal.

6. The circuit of claim 1, wherein said terminal C is at a voltage near to said supply voltage after said second signal input drops from a more positive voltage level to a more negative voltage level.

7. The circuit of claim 2, wherein said first n-channel transistor is not conducting prior to said second signal input dropping from a more positive voltage level to a more negative voltage level.

8. The circuit of claim 3, wherein said first p-channel transistor is conducting after said second signal input drops from a more positive voltage level to a more negative voltage level.

9. The circuit of claim 3, wherein said second p-channel transistor is conducting prior to said second signal input dropping from a more positive voltage level to a more negative voltage level.

10. The circuit of claim 3, wherein said second n-channel transistor is conducting prior to said second signal input dropping from a more positive voltage level to a more negative voltage level.

11. An edge detection circuit comprising:

a logic section having a first and a second signal input and a first output of the logic section and a second output of the logic section, said logic section outputs providing signal gating;

a conditioning section coupled to said first and second signal inputs and a third input, said third input connected to said first output of said logic section, and an output, said output of said conditioning section connected to a terminal C, said conditioning section determining the voltage level at said terminal C;

an output section with an input and an output, said input of said output section connected to said terminal C, said output of said output section providing a disable control; and an N-channel transistor section having a source terminal, a drain terminal and a gate terminal, said drain terminal connected to said terminal C, said source terminal connected to said second output of the logic section, and said gate terminal connected to the second signal input, said N-channel transistor section inhibiting a glitch from propagating through to said terminal C, said N-channel transistor section comprising a blocking n-channel transistor which is biased outside the saturation region for a fast turn-off.

12. The circuit of claim 11, wherein said logic section comprises:

a reference potential;

said first signal input, to which a first signal is applied, said signal corresponding to a transition in voltage;

said second signal input, to which a second signal is applied, said signal corresponding to a transition in voltage;

a first inverter with an input and an output, said inverter having a predetermined signal delay, said input of said first inverter connected to said first signal input, a first 2-input NAND gate with an output, with one input of said first NAND gate connected to the output of said first inverter and the other input of said first NAND gate connected to said second signal input, said output of said first 2-input NAND gate corresponding to said first output of said logic section;

a second 2-input NAND gate with an output, with one input of said second NAND gate connected to said second signal input and the other input of said second NAND gate connected to the output of said first NAND gate;

a second inverter with an input and an output, said input of said second inverter connected to the output of said second NAND gate; and a first n-channel transistor having a source-drain path and a gate, said source-drain of said first n-channel transistor connected between the reference potential and said second output of said logic section, and said gate of said first n-channel transistor connected to the output of said second inverter.

13. The circuit of claim 11, wherein the conditioning section comprises:

a supply voltage;

a first inverter with an input and an output, said input of said first inverter connected to said second signal input;

a second inverter with an input and an output, said input of said second inverter connected to said output of said first inverter;

a first p-channel transistor having a source-drain path and a gate, said source-drain of said first p-channel transistor connected between the supply voltage and said output of the conditioning section, said gate of said first p-channel transistor connected to the output of the second inverter;

a second p-channel transistor having a source-drain path and a gate, said source-drain of said second p-channel transistor connected between the first signal input and said output of the conditioning section, the gate of said second p-channel transistor connected to said first output of said logic section;

a third inverter with an input and an output, said input of said third inverter connected to said first output of said logic section; and a second n-channel transistor having a source-drain path and a gate, said source-drain of said second n-channel transistor connected between said output of the conditioning section and the first signal input, said gate of said second n-channel transistor connected to the output of the third inverter.

14. The circuit of claim 11, wherein the output section comprises:

a first inverter with an input and an output, said input of said first inverter connected to said input of said output section, said output of said first inverter connected to the output of said output section; and a first p-channel transistor having a source-drain path and a gate, said source-drain of said first p-channel transistor connected between a supply voltage and said input of said output section, and said gate of said first p-channel transistor connected to the output of the first inverter.

15. The circuit of claim 11, wherein the N-channel transistor section comprises:

said blocking n-channel transistor having a source-drain path and a gate, said source of said blocking n-channel transistor corresponding to said source terminal, said drain of said blocking n-channel transistor corresponding to said drain terminal and said gate of said blocking n-channel transistor corresponding to said gate terminal.

16. The circuit of claim 15, wherein the gate of said blocking n-channel transistor is directly connected to the second signal input causing the least possible switching delay in said blocking n-channel transistor when said second signal input drops from a more positive voltage level to a more negative voltage level.

17. The circuit of claim 15, wherein the source of said blocking n-channel transistor is biased one threshold drop from said gate of said blocking n-channel transistor.

* * * * *